United States Patent
King

(10) Patent No.: US 6,515,327 B1
(45) Date of Patent: Feb. 4, 2003

(54) TRENCH CAPACITOR WITH EXPANDED AREA AND METHOD OF MAKING THE SAME

(75) Inventor: Wei-Shang King, Hsinchu (TW)

(73) Assignee: Mosel Vitelic Inc., Taiwan (CN)

( * ) Notice: Subject to any disclaimer, the term of this patent is extended or adjusted under 35 U.S.C. 154(b) by 152 days.

(21) Appl. No.: 09/691,560

(22) Filed: Oct. 18, 2000

(30) Foreign Application Priority Data

Oct. 19, 1999 (TW) .................................. 88118082 A

(51) Int. Cl.[7] .............................................. H01L 27/108
(52) U.S. Cl. ...................... 257/304; 257/300; 257/302; 257/303; 257/305; 257/331; 438/386; 438/242; 438/243; 438/392; 438/387
(58) Field of Search ................................. 438/242, 243, 438/392, 249, 386, 387; 257/302, 300, 304, 303, 305, 331

(56) References Cited

U.S. PATENT DOCUMENTS

| | | | | | |
|---|---|---|---|---|---|
| 5,482,883 | A | * | 1/1996 | Rajeevakumar | 438/249 |
| 5,618,751 | A | * | 4/1997 | Golden et al. | 438/392 |
| 5,744,386 | A | * | 4/1998 | Kenney | 438/242 |
| 6,200,873 | B1 | * | 3/2001 | Schrems et al. | 438/242 |
| 6,265,742 | B1 | * | 7/2001 | Gruening et al. | 257/302 |
| 6,310,375 | B1 | * | 10/2001 | Schrems | 257/300 |
| 6,331,459 | B1 | * | 12/2001 | Gruening | 438/243 |
| 6,410,391 | B1 | * | 6/2002 | Zelsacher | 438/242 |
| 6,426,253 | B1 | * | 7/2002 | Tews et al. | 438/243 |

FOREIGN PATENT DOCUMENTS

DE          199 56 078 A1 *  5/2002  .......... H01L/21/00

* cited by examiner

Primary Examiner—Vuthe Siek
Assistant Examiner—V. Yevsikov
(74) Attorney, Agent, or Firm—Peter F. Corless; Steven M. Jensen; Edwards & Angell, LLP

(57) ABSTRACT

A trench capacitor with an expanded area for use in a memory cell and a method for making the same are provided. The trench capacitor includes a vertical trench formed in a semiconductor, a doping region formed around a low portion of the trench, a collar isolation layer formed on an inner sidewall of an upper portion of the trench, a doped silicon liner layer formed on a surface of the collar isolation layer, wherein the doped silicon liner layer is electrically connected to the doping region, a dielectric layer formed on a surface of the doped silicon liner layer and inner sidewall of the lower portion of the trench, and a doped silicon material formed inside the trench. The method includes steps of (a) forming a vertical trench in a semiconductor substrate, (b) filling a sacrificing material into a lower portion of the trench, (c) forming a collar isolation layer on an inner sidewall of an upper portion of the trench, (d) removing top of the sacrificing material to expose a belt of inner sidewall of the lower portion, (e) forming a doped silicon liner layer to cover the collar isolation layer and the belt of inner sidewall of the lower portion, (f) removing the sacrificing material, (g) forming a doping region around the lower portion of the trench, (h) forming a dielectric layer on all inner surface of the trench, and (i) filling a doped silicon material into the trench.

8 Claims, 6 Drawing Sheets

TRENCH CAPACITOR WITH EXPANDED AREA AND METHOD OF MAKING THE SAME

FIELD OF THE INVENTION

The present invention relates to a trench capacitor for use in a memory cell and a method for making the same. Particularly, the resent invention relates to a trench capacitor with an expanded area for se in a memory cell and a method for making the same.

BACKGROUND OF THE INVENTION

The total storage capacitance of a trench capacitor is determined by the total active surface area of the trench capacitor. The present invention focuses on how to increase the storage capacitance by increasing the surface area of a trench capacitor.

FIG. 1 shows the structure of a conventional memory cell formed in a semiconductor substrate. Conventionally, the trench capacitor is only formed in the lower portion of a trench. The semiconductor substrate has a first well region 14 and a second well region 16, wherein the first well region 14 is preferably a buried N-well and the second well region 16 is preferably a P-well. Although the trench is vertically extended through the first 14 and second well region 16, the surface area of the trench capacitor can only be the sidewall at the lower portion of the trench (with a length marked "d" in FIG. 1). Obviously, the sidewall at the upper portion has no substantial contribution to the storage capacitance.

Conventionally, as shown in FIG. 1, the inner sidewall of the trench is covered with a collar oxide layer 12. The buried N-well 14, a doped amorphous-silicon material 13, and a source of the DRAM 15 are used as the source, gate, and drain of the vertical transistor 17 respectively. If the effective channel length (marked "m" in FIG. 1) of the vertical transistor 17 is reduced, a leakage current between the source of the DRAM 15 and the buried N-well 14 might easily be induced. Since the leakage current is fatal to the reliability of the memory cell, the length of the collar oxide layer 12 of the conventional trench capacitor should be kept with at least a minimum length to prevent the leakage current from being induced. Therefore, according to the conventional art, the limited length of the collar oxide layer 12 makes it hard to increase the storage capacitance of the memory cell.

It is therefore attempted by the present applicant to deal with the above situation encountered with the prior art.

SUMMARY OF THE INVENTION

An object of the present invention is to provide a novel trench capacitor and a method for making the same such that the aforementioned limitations and difficulties encountered in the prior art can be overcome.

Another object of the present invention is to provide a novel trench capacitor with an expanded area for effectively increasing the storage capacitance thereof.

According to one aspect of the present invention, a method of forming a trench capacitor for use in a memory cell is provided. The method comprises steps of (a) forming a vertical trench in a semiconductor substrate, (b) filling a sacrificing material into a lower portion of the trench, (c) forming a collar isolation layer on an inner sidewall of an upper portion of said trench, (d) removing top of the sacrificing material to expose a belt of inner sidewall of the lower portion, (e) forming a doped silicon liner layer to cover the collar isolation layer and the belt of inner sidewall of the lower portion, (f) removing the sacrificing material, (g) forming a doping region around the lower portion of the trench, (h) forming a dielectric layer on all inner surface of the trench, and (i) filling a doped silicon material into the trench.

Preferably, after the step (b), the method further includes a step (b1) of etching back.

Preferably, the sacrificing material is an oxide material.

Preferably, the collar isolation layer includes a thin thermal oxide layer and a silicon nitride layer.

Preferably, the step (d) is achieved by etching back via using a hydrofluoric (HF) solution.

Preferably, after the step (e), the method further includes a step (e1) of etching back.

Preferably, the doping region is serving as an outer capacitor plate of the trench capacitor.

Preferably, the doping region is a $N^+$ out-diffusion area.

Preferably, the step (g) is achieved by a method selecting from arsenic glass (AsG) doping and self-aligned gas doping via outward diffusion of the arsenic ion in the trench.

Preferably, the dielectric layer is serving as a charge storage layer of the trench capacitor.

Preferably, the dielectric layer is an oxide-nitride-oxide (O/N/O) layer.

Preferably, the dielectric layer is an oxide-nitride (O/N) layer.

Preferably, the doped silicon material is serving as an inner capacitor plate of the trench capacitor. Preferably, after the step (i), the method further includes the steps of (i1) wet etching; and (i2) filling a doped silicon material on top of the trench.

According to another aspect of the present invention, a trench capacitor for use in a memory cell is provided. The trench capacitor comprises a vertical trench formed in a semiconductor, a doping region formed around a low portion of the trench, a collar isolation layer formed on an inner sidewall of an upper portion of the trench, a doped silicon liner layer formed on a surface of the collar isolation layer, wherein the doped silicon liner layer is electrically connected to the doping region, a dielectric layer formed on a surface of the doped silicon liner layer and inner sidewall of the lower portion of the trench, and a doped silicon material formed inside the trench.

Preferably, the doping region is serving as an outer capacitor plate of the trench capacitor.

Preferably, the doping region is a $N^+$ out-diffusion area.

Preferably, the collar isolation layer includes a thin thermal oxide layer and a silicon nitride layer.

Preferably, the dielectric layer is serving as a charge storage layer of the trench capacitor.

Preferably, the dielectric layer is an oxide-nitride-oxide (O/N/O) layer.

Preferably, the dielectric layer is an oxide-nitride (O/N) layer.

Preferably, the doped silicon material is serving as an inner capacitor plate of the trench capacitor.

The present invention may best be understood through the following description with reference to the accompanying drawings, in which:

DETAILED DESCRIPTION OF THE PREFERRED EMBODIMENTS

Figure 1:
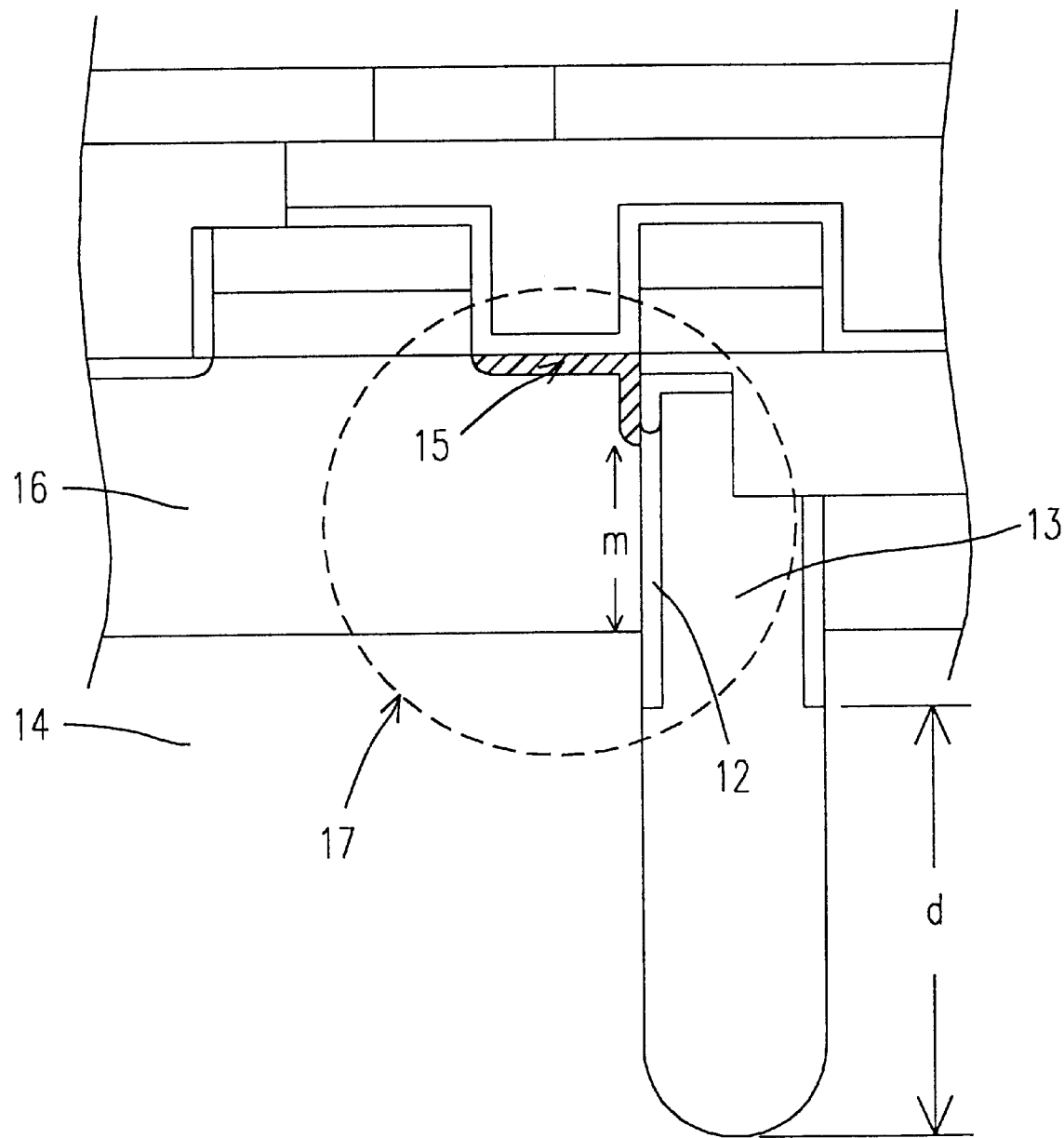
FIG. 1 schematically shows the structure of a conventional memory cell.
Figure 2:
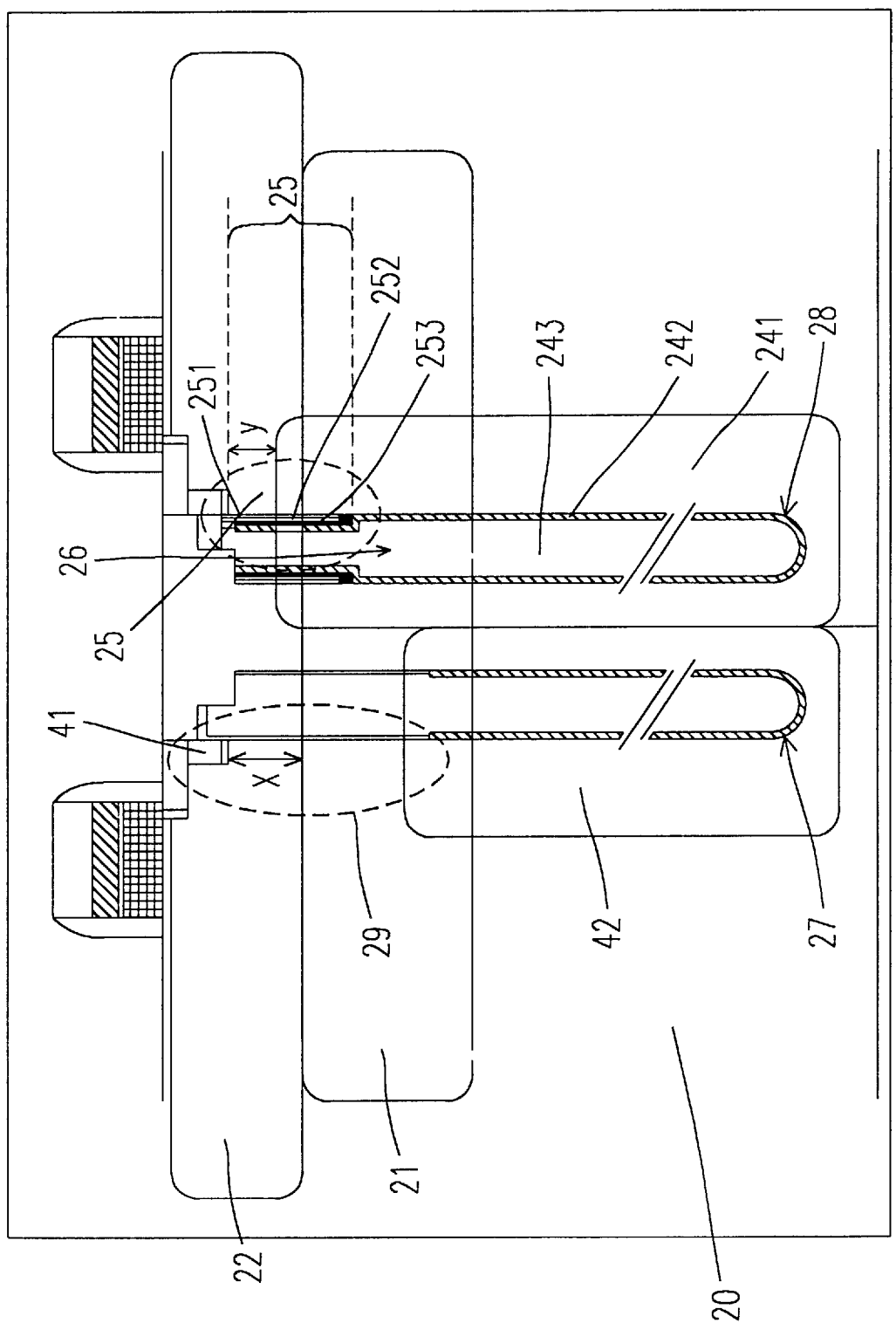
FIG. 2 schematically shows a structure of the conventional trench capacitor and that of a novel trench capacitor formed according to the present invention.

FIG. 2 schematically shows a structure of the conventional trench capacitor and that of a novel trench capacitor formed according to the present invention. The left one 27 is the conventional trench capacitor, and the right one 28 is the novel trench capacitor formed according to the present invention. Both two trench capacitors 27, 28 are built in a semiconductor substrate 20, having a first well region 21 and a second well region 22. Preferably, the first well region 21 is a buried N-well region and the second well region 22 is a P-well region.

Figure 3A:
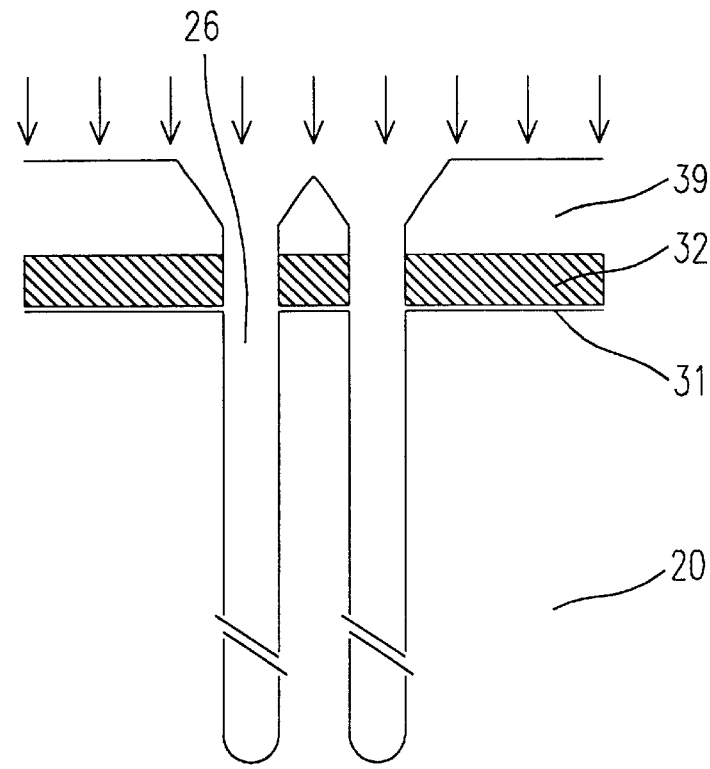
FIGS. 3(a)~(h) schematically show the process of forming the novel trench capacitor according to the present invention.

As shown in FIG. 2, the first electrode layer 241 and the doped amorphous-silicon liner layer 253, the dielectric layer 242 and the second electrode layer 243 respectively serve as the outer capacitor plate, the charge storage area and the inner capacitor plate of the novel trench capacitor 28. In this embodiment, the dielectric layer 242 is a conventional oxide-nitride-oxide (O/NO) film. The first electrode layer 241 is a $N^+$ out-diffusion area. Preferably, the $N^+$ out-diffusion area can be formed by arsenic glass (AsG) doping or self-aligned gas doping via outward diffusion of the Arsenic ion in the trench 26. Preferably, the second electrode layer 243 is formed by depositing doped amorphous silicon. The collar region 25 comprises the thin thermal oxide layer 251, the silicon nitride layer 252 and the doped amorphous-silicon liner layer 253. The thin thermal oxide layer 251 and the silicon nitride layer 252 serve as the collar isolation layer. According to the conventional trench capacitor 27, the gate voltage of the vertical transistor 29 is generally operated at Vcc, and the voltage of the first well region 21 is generally operated at ½ Vcc. Therefore, the effective channel length (marked "x" in FIG. 2) must be kept with at least a minimum length for preventing leakage current between the drain 21 and the source 41 of the vertical transistor 29 being induced. On the contrary, according to the novel trench capacitor 28, because of electrical connection of the doped amorphous-silicon liner layer 253 and the $N^+$ out-diffusion area 241, the gate voltage of the vertical transistor 23 would decrease to half of the original value, i.e. ½ Vcc. Comparing with the conventional trench capacitor, the leakage current would not be so easy to be induced, and thus the effective channel length (marked "y" in FIG. 2) of the vertical transistor 23 can be decreased. Therefore, the length of the collar region 23 can be decreased, and thus the outer capacitor plate of the novel trench capacitor 28 can be extended from the $N^+$ out-diffusion area 241 into the collar region 25. In other words, the surface area of the trench capacitor is enlarged by utilizing the collar region 25. Certainly, the storage capacitance of the trench capacitor 28 can be also increased. Please refer to FIGS. 3(a)~(h), which schematically show the process of forming the novel trench capacitor according to the present invention. In FIG. 3(a), a trench 26 is formed in a semiconductor substrate 20, which has the pad oxide layer 31 thereon, the pad nitride layer 32 thereon and the oxidization hard mask layer 39 thereon, by lithography and dry etching. Preferably, the oxidization hard mask layer 39 is a boron silicon glass (BSG) layer.

Figure 3B:
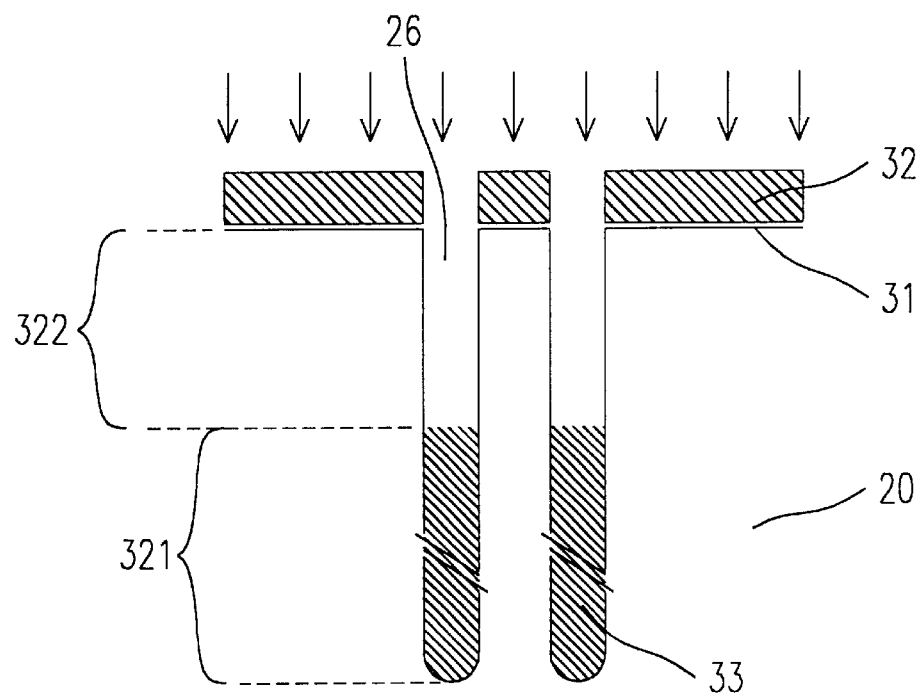

In FIG. 3(b), a sacrificing material 33, preferably an oxide material, is filled into the trench 26 by chemical vapor deposition (CVD). Thereafter, by etching back, the sacrificing material 33 is remained in the lower portion 321 of the trench 26, and the upper portion 322 is emptied for serving as the collar region 25 as depicted in FIG. 2.

Figure 3C:
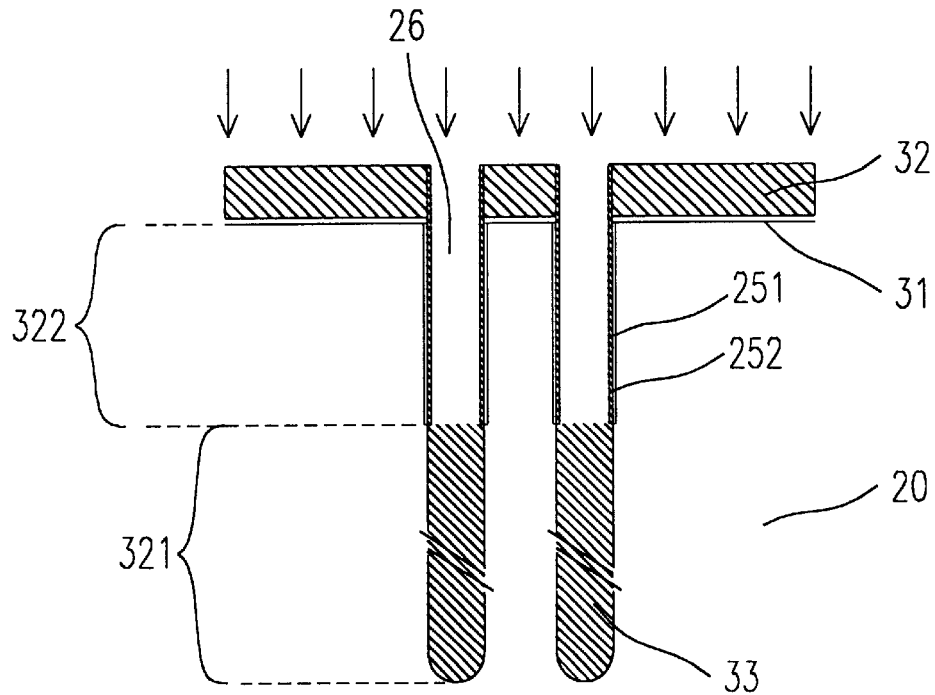
Figure 3D:
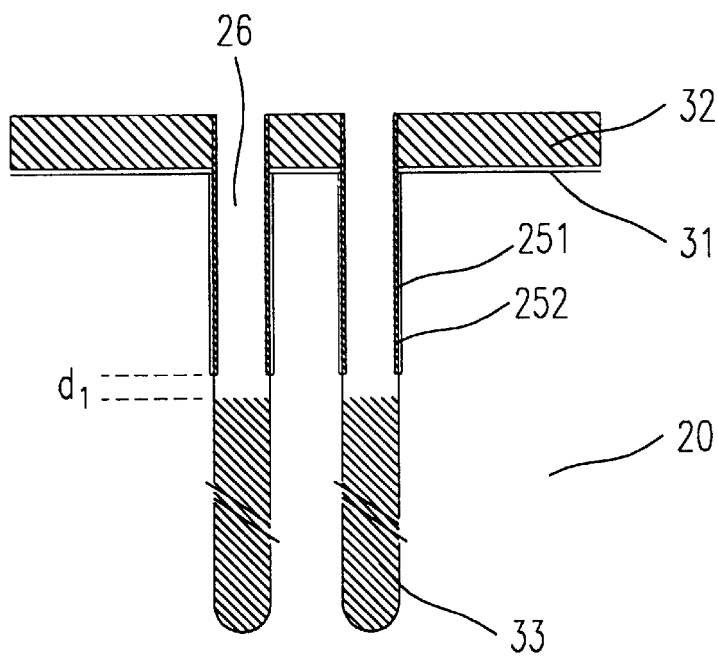
Figure 3E:
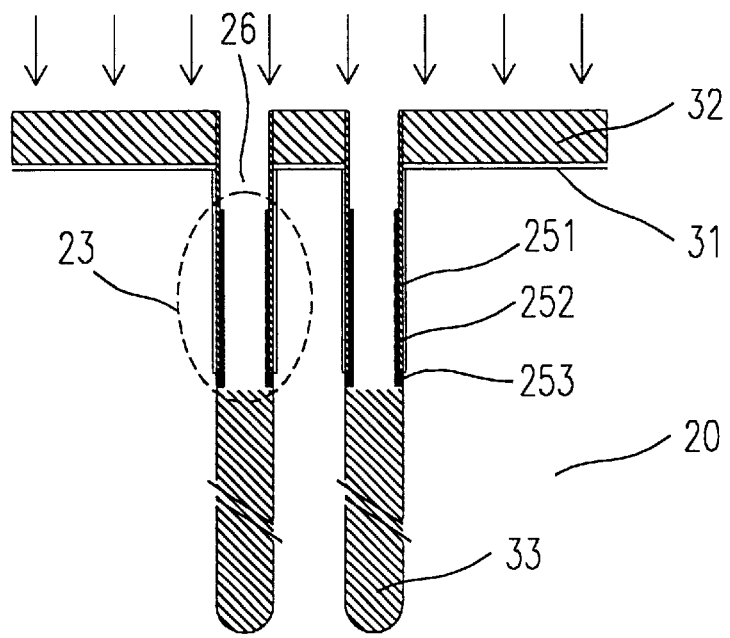

FIGS. 3(c)~(e) schematically shows the steps of forming a vertical transistor 23 at the upper portion 322 of the trench 26. In FIG. 3(c), a thin thermal oxide layer 251 is formed on an inner sidewall of the upper portion 322 of the trench by thermal oxidation, and a silicon nitride layer 252 is formed on the thin thermal oxide layer 251 by chemical vapor deposition (CVD).

As shown in FIG. 3(d), before a doped amorphous-silicon liner layer 253 is formed, the top of the sacrificing material 33 has to be removed to expose a belt of inner sidewall of the lower portion 321 (the gap labeled is d1) for allowing the doped amorphous-silicon liner layer 253 being formed therein later on in order to electrically connect the doped amorphous-silicon liner layer 253 with the $N^+$ out-diffusion area 241. Preferably, the removal for exposing the belt of inner sidewall can be achieved by dipping in a hydrofluoric (HF) solution.

As shown in FIG. 3(e), the doped amorphous-silicon liner layer 253 is formed to cover the silicon nitride layer 252 and the belt of sidewall by chemical vapor deposition (CVD). Thereafter, by etching back, the doped amorphous-silicon liner layer 253 over the surface of the sacrificing material 33 and on the inner sidewall of the top of the trench is removed for prevent the doped silicon material 38 from being electrically connected to the doped amorphous-silicon liner layer 253 (as shown in FIG. 3(h)). As mentioned above, since the doped amorphous-silicon liner layer 253 is electrically connected to the $N^+$ out-diffusion area 241, a leakage current of the vertical transistor 23 is not easily induced.

Figure 3F:
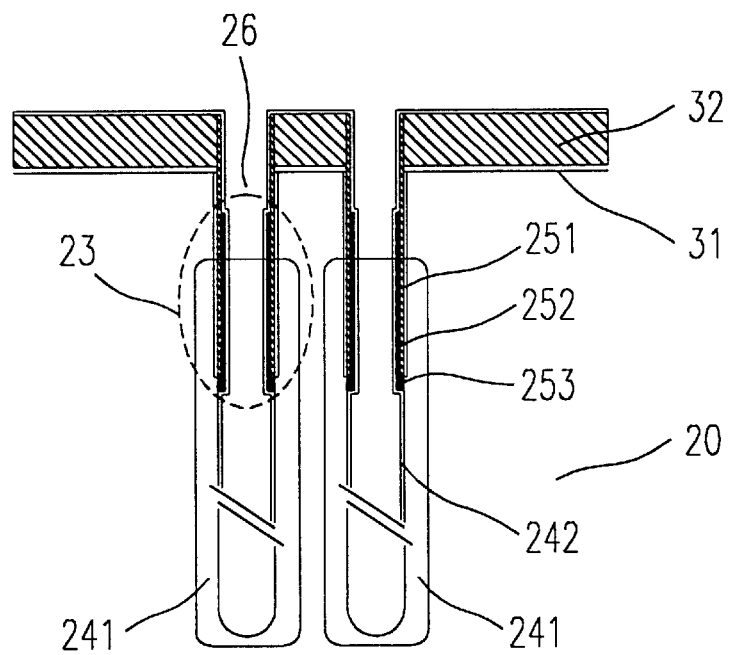

In FIG. 3(f), all of the sacrificing material 33 in the trench are removed by ashing. Thereafter, $N^+$ out-diffusion area 241 is formed by arsenic glass (AsG) doping or self-aligned gas doping via outward diffusion of the arsenic ion in the trench 26. Then, an oxide-nitride-oxide (ONO) layer 242 (or an oxide-nitride (O/N) layer) is formed on all inner surface area of the trench, including a surface area of the upper portion 322, for serving as charge storage area of the novel trench capacitor.

Figure 3G:
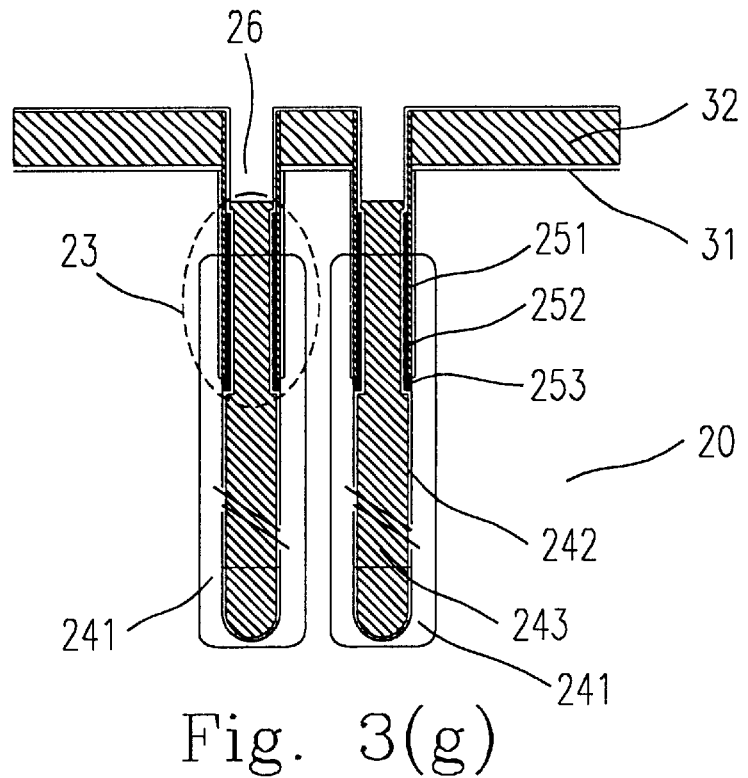
Figure 3H:
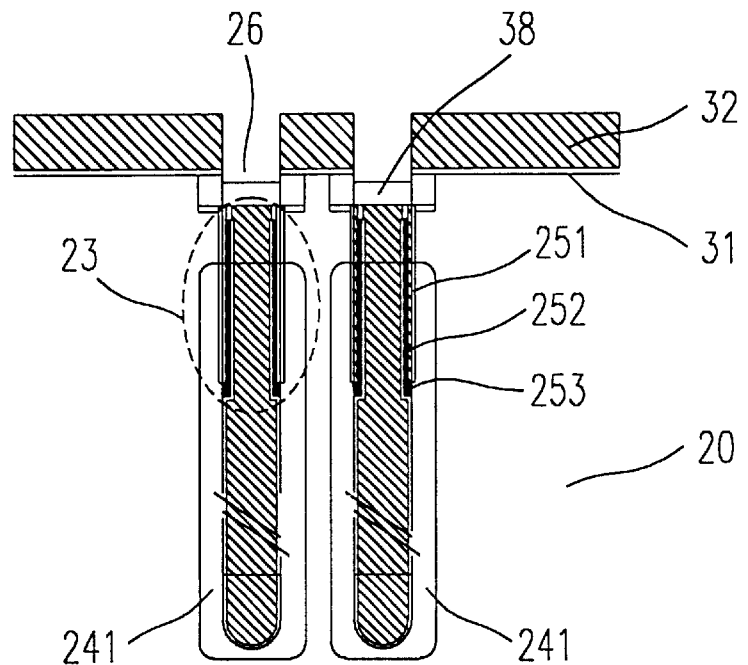

In FIG. 3(g), the trench is then filled with a doped amorphous-silicon material by chemical vapor deposition (CVD) for serving as the second electrode layer 243. Thereafter, an etching back step is performed.

In FIG. 3(h), after an wet etching step is performed, a doped silicon material is filled on top of the trench 26 for forming the buried strap structure, and some follow-up procedures are also done to complete forming a memory cell.

In conclusion, by utilizing the upper portion of the trench capacitor, the active surface area of the trench capacitor is increased. In addition, the reliability of the memory cell is improved.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A trench capacitor for use in a memory cell, comprising:

a vertical trench formed in a semiconductor;

a doping region formed around a low portion of said trench;

a collar isolation layer formed on an inner sidewall of an upper portion of said trench;

a doped amorphous silicon liner layer formed on a surface of said collar isolation layer, wherein said doped silicon liner layer is electrically connected to said doping region;

a dielectric layer formed on a surface of said doped amorphous-silicon liner layer and inner sidewall of said lower portion of said trench; and a doped silicon material formed inside said trench.

2. The trench capacitor according to claim 1, wherein said doping region is serving as an outer capacitor plate of said trench capacitor.

3. The trench capacitor according to claim 2, wherein said doping region is a $N^+$ out-diffusion area.

4. The trench capacitor according to claim 1, wherein said collar isolation layer includes a thin thermal oxide layer and a silicon nitride layer.

5. The trench capacitor according to claim 1, wherein said dielectric layer is serving as a charge storage layer of said trench capacitor.

6. The trench capacitor according to claim 5, wherein said dielectric layer is an oxide-nitride-oxide (O/N/O) layer.

7. The trench capacitor according to claim 5, wherein said dielectric layer is an oxide-nitride (O/N) layer.

8. The trench capacitor according to claim 1, wherein said doped amorphous silicon liner is serving as an inner capacitor plate of said trench capacitor.

* * * * *